United States Patent

Pezzani et al.

[11] Patent Number: 5,982,016
[45] Date of Patent: Nov. 9, 1999

[54] MONOLITHIC COMPONENT ASSOCIATING A HIGH-VOLTAGE COMPONENT AND LOGIC COMPONENTS

[75] Inventors: Robert Pezzani, Vouvray; Eric Bernier, Mettray, both of France

[73] Assignee: SGS-Thomson Microelectronics S.A., Saint Genis, France

[21] Appl. No.: 08/896,081

[22] Filed: Jul. 17, 1997

[30] Foreign Application Priority Data

Jul. 26, 1996 [FR] France .................................. 96 09682

[51] Int. Cl.⁶ .............................. H01L 29/74; H01L 29/96
[52] U.S. Cl. ...................... 257/502; 257/122; 257/124; 257/162; 257/500
[58] Field of Search .................................. 257/124, 502, 257/162, 152, 122, 126, 500, 119, 499, 592, 378

[56] References Cited

U.S. PATENT DOCUMENTS

| | | | |
|---|---|---|---|
| 4,475,280 | 10/1984 | Ragonese et al. | 438/340 |
| 4,520,277 | 5/1985 | Hahn | 327/441 |
| 4,546,370 | 10/1985 | Curran | 257/370 |
| 5,608,235 | 3/1997 | Pezzani | 257/124 |

OTHER PUBLICATIONS

French Search Report from French Patent Application 96 09682, filed Jul. 26, 1996.
Patent Abstracts of Japan, vol. 005, No. 027 (E–046), Feb. 18, 1981 & JP–A–55 154764 (Mitsubishi Electric Corp.).
Patent Abstracts of Japan, vol. 014, No. 190 (E–0918), Apr. 18, 1990 & JP–A–02 039470 (Matsushita Electron Corp.).

*Primary Examiner*—Jerome Jackson, Jr.
*Assistant Examiner*—Bradley William Baumeister
*Attorney, Agent, or Firm*—Wolf, Greenfield & Sacks, P.C.

[57] ABSTRACT

A monolithic component including, in an N-type lightly-doped substrate of a semiconductor wafer, two portions separated by a P-type insulating wall. A first portion of the two portions includes a high voltage lateral component, a layer of which substantially corresponds to the thickness of the wafer. The second portion includes logic circuit components. A rear surface of the substrate includes a P-type layer coated with a metallization. The insulating wall is in electrical contact with a low voltage terminal of the high voltage lateral component, such as the gate region of a thyristor. The logic portion includes at least one vertical component.

33 Claims, 3 Drawing Sheets

MONOLITHIC COMPONENT ASSOCIATING A HIGH-VOLTAGE COMPONENT AND LOGIC COMPONENTS

BACKGROUND OF THE INVENTION

1. Field of the Invention

The present invention relates to the implementation of at least one high voltage component and logic circuits in monolithic form.

2. Discussion of the Related Art

High voltage components, such as thyristors, which are frequently used to block voltages higher than 600 V, are generally implemented in semiconductor wafers, one of the layers forming the component substantially corresponding to the thickness of the wafer. Of particular interest are technologies in which the rear or lower surface of the component is uniformly coated with a metallization in direct contact with the semiconductor.

FIG. 1 illustrates an example embodiment of a monolithic structure associating a high voltage component and logic circuits.

This structure is implemented in a semiconductor layer 1, for example, of type N corresponding to the semiconductor substrate. In the right portion 3 of the wafer, a vertical thyristor is shown. On the rear or lower surface side of substrate 1, a P-type region 2 is formed, and on the front or upper surface side a P-type well 4 is formed in which an N-type region 5 is also formed. An anode metallization M1 forms one piece with the rear surface. A cathode metallization M2 covers region 5. A metallization M3 covers a portion of P-type region 4 and forms the cathode gate G of the thyristor. This vertical thyristor is insulated from the remainder of the monolithic structure by a P-type wall 6, generally formed at the beginning of the fabrication process by drive-ins extending from the upper and lower surfaces of the wafer. Reference 7 has been used to designate $N^+$-type regions used, conventionally, as channel stops. On the left side of the substrate, insulated from the thyristor by wall 6, several logic components can be formed in a P-type well 8. However, since the rear surface of N-type substrate 1 is coated with metallization M1, this rear surface is likely to be at the highest potential applied to this metallization, for example, a potential of approximately one thousand volts. This imposes a great number of insulation restraints on the components formed in well 8 and makes it very difficult to form components directly within the upper surface of substrate 1.

In the related art various solutions have attempted to improve this situation, and notably, to satisfactorily bias well 8 so that it remains properly insulated from the high voltage.

One conventional solution to solve this problem of insulating the logic portion consists of coating the bottom of the wafer facing the logic portion with an insulating layer over which metallization M1 is then deposited. This technique provides excellent results but is complex to implement and is incompatible with some manufacturing processes.

SUMMARY OF THE INVENTION

An object of the present invention is to provide a monolithic structure that incorporates a high voltage component and logic circuits and reduces the insulation restraints imposed on the logic circuit.

Another object of the present invention is to provide such a monolithic structure wherein the logic circuit includes a vertical component whose rear surface terminal corresponds to the control terminal of an integrated high voltage component.

Another object of the present invention is to provide such a monolithic structure that may be simply implemented using current fabrication techniques.

To achieve these objects, the present invention provides a monolithic component formed in a lightly-doped semiconductor wafer of a first type of conductivity, including at least two portions separated by an insulating wall of a second type of conductivity, a first portion including at least one high voltage component, a layer of which substantially corresponds to the thickness of the wafer, and a second portion including logic circuit components, the rear surface being uniformly coated with a metallization in contact with semiconductor areas of the wafer. The high voltage component is implemented laterally, the insulating wall being in electrical contact with a control region of the component and having the same type of conductivity as the insulating wall. The logic portion includes at least one vertical component having a main terminal which corresponds to the rear surface metallization.

According to an embodiment of the present invention, the rear surface of the substrate includes a layer of the type of conductivity opposite to that of the substrate.

According to an embodiment of the present invention, the wafer is of type N, the insulating wall is of type P, and the high voltage component is a lateral thyristor whose cathode gate region is connected to the insulating wall.

According to an embodiment of the present invention, the vertical component of the logic portion is a thyristor.

According to an embodiment of the present invention, the high voltage component is a lateral transistor having its base region connected to the insulating wall.

According to an embodiment of the present invention, the high voltage component is a lateral insulated grid turn-on and gate turn-off thyristor, having its cathode gate region connected to the insulating wall.

BRIEF DESCRIPTION OF THE DRAWINGS

These objects, characteristics and advantages as well as others, of the present invention, will be discussed in detail in the following non-limiting description of specific embodiments of the present invention, in relation with the accompanying drawings, in which.

DETAILED DESCRIPTION

According to an aspect of the present invention, a lateral-type high voltage component is provided. Then, the rear surface of the structure is at a low potential substantially corresponding to the potential of the control electrode of the component, and the insulation restraints previously required by the logic circuits disappear. This approach is in contrast with conventional wisdom which holds, when it is desired to obtain a high voltage component, that a vertical structure has to be used. In fact, the present inventors have noted that it is sufficient to provide in the component structure at least one thick layer capable of withstanding a high voltage, that is, a layer occupying substantially the thickness of a semiconductor layer. A lateral component formed on a solid substrate meets this requirement.

An embodiment of the present invention provides to place a vertical component in the logic portion of the structure, this vertical component constituting a switch having a terminal connected to the control terminal of the high voltage component.

Figure 1:
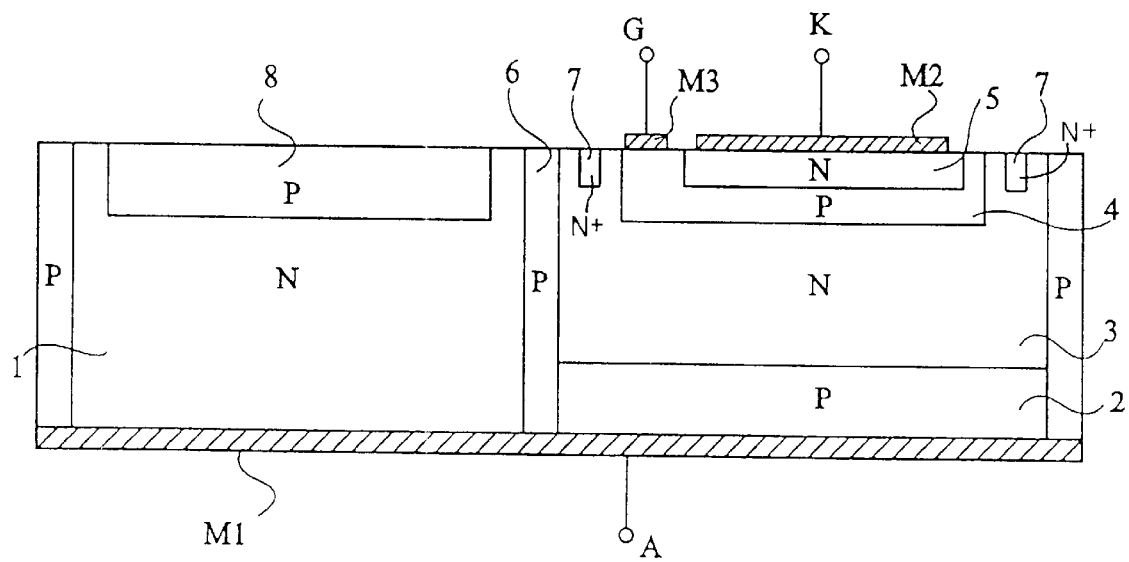
FIG. 1 shows a conventional monolithic structure incorporating a high voltage component and logic circuits.
Figure 2:
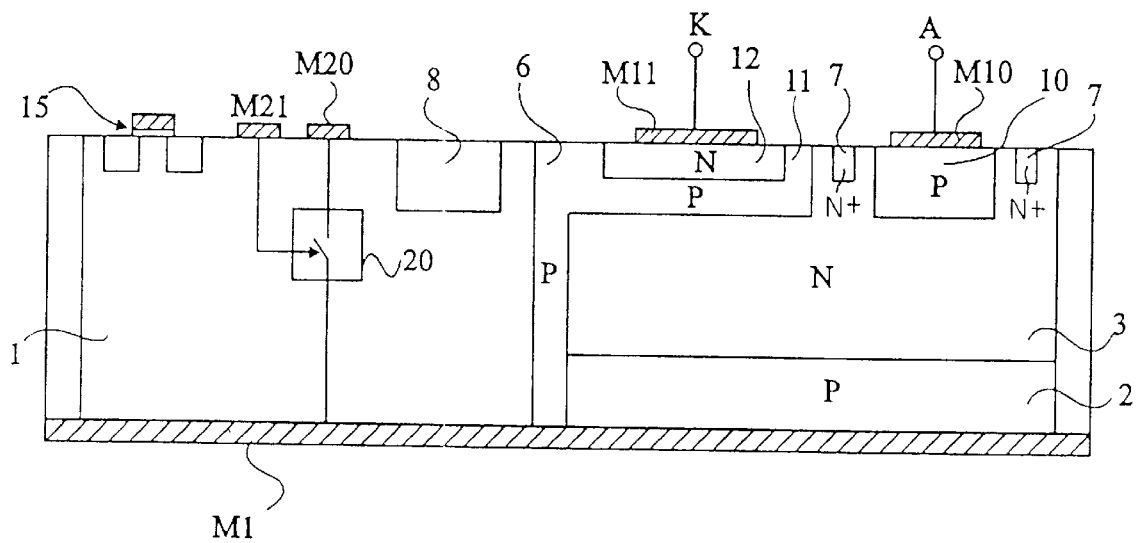
FIG. 2 partially shows, as blocks, a monolithic structure incorporating a high voltage component and logic circuits according to an aspect of to the present invention.

FIG. 2 partially illustrates, in the form of blocks, an embodiment of the present invention wherein the high voltage component is a thyristor.

The right portion of FIG. 2 shows a lateral thyristor, separated by a P-type insulating wall 6 from logic components formed in the left portion of the drawing. The lateral thyristor is formed in a well 3 of substrate 1 limited by insulating wall 6 and a rear surface P-type layer 2. A first P-type region 10 forms the anode region of the thyristor. A second P-type region 11 forms its cathode-gate region and contains an N-type region 12 forming its cathode region. A metallization M10 is formed upon region 10 and corresponds to the anode of the lateral thyristor. A metallization M11 is in contact with region 12 and constitutes the cathode of the lateral thyristor. Cathode-gate region 11 is in contact with insulating wall 6 or is connected thereto by a metallization (not shown). It should be noted that rear surface metallization M1 is electrically connected to this gate region via insulating wall 6 and can constitute a gate connection.

P-type rear surface 2 not only has an insulating function, but also a function of increasing the gain of the lateral thyristor.

The thyristor gate region is at a potential close to that of its cathode. The cathode generally being grounded, metallization M1 is at a potential included between 0 and approximately ten volts, that is, a much lower value than the maximum anode voltage (of approximately one thousand volts).

Accordingly, logic components can be formed without requiring specific precautions in the left portion of the structure, separated from the high voltage component by insulating wall 6. These logic components can either be formed in a P-type well 8 or, as MOS transistor 15, directly in the upper surface of substrate 1. Many types of bipolar or MOS logic components can be used.

Another embodiment of the present invention provides to place in the logic portion a vertical component constituting a switch 20 having a terminal which corresponds to rear surface metallization M1 and another terminal which is connected, possibly via other components, to a metallization M20 and a control terminal which is connected, possibly with other components interposed, to a metallization M21.

This structure is particularly attractive since, in a monolithic structure incorporating a high voltage component and a logic circuit, the logic circuit frequently includes a connection to the control terminal of the high voltage component. Here, this connection is implemented by minimally reducing the surface of the logic circuit and the number of other metallizations that may be formed on the upper surface, since it is provided directly in the thickness of the layer.

Figure 3:
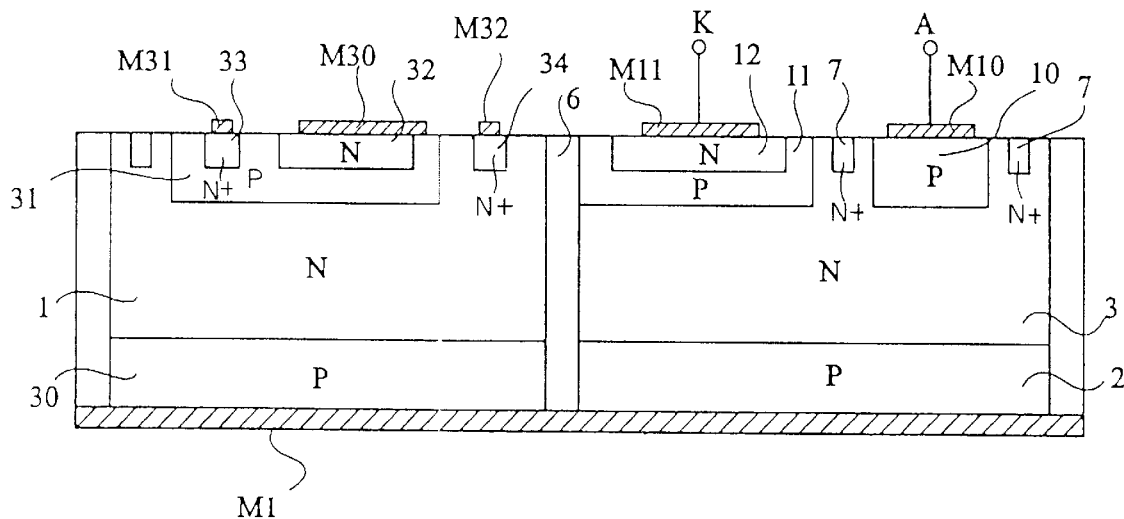
FIG. 3 shows an exemplary embodiment of a monolithic component according to an aspect of the present invention.

A particular example of an application of the present invention is illustrated in FIG. 3. The high voltage component is identical to that illustrated in FIG. 2. On the logic portion side, on the rear surface of the structure, a P-type layer 30 is implemented, which is identical to region 2 and which may be conveniently formed during the same fabrication step, that is, it will be possible to perform a diffusion without masking the rear surface of the component, thus simplifying its fabrication. In the upper surface of the substrate, is a P-type well 31 in which are formed a main region 32 and an N-type auxiliary region 33. A highly doped N-type region 34 is formed directly in the upper surface of the substrate, outside of well 31. Region 32 and a region adjacent to well 31 are coated with a metallization M30. Region 33 is coated with a metallization M31. Region 34 is coated with a metallization M32.

Figure 4:
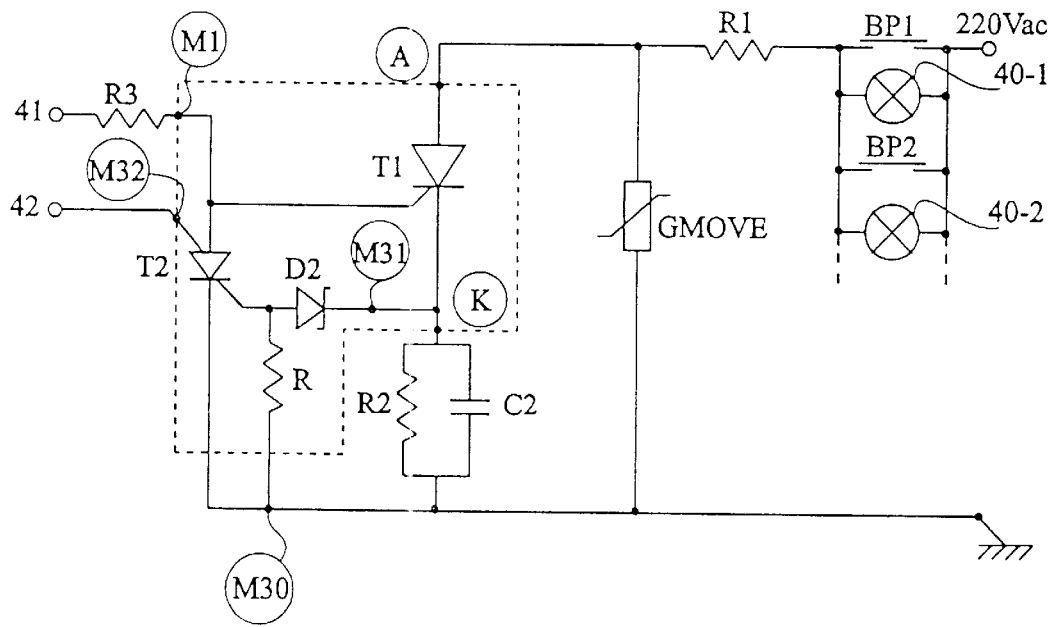
FIG. 4 shows a circuit, part of which is implemented by the component of FIG. 3.

The logic circuit formed in the left portion of the drawing corresponds to the portion in dotted lines of the circuit of FIG. 4. Only this portion will be considered herein, as the remainder of the circuit will be described further on.

Layers 30-1-31-32 altogether form a vertical thyristor T2, the anode of which corresponds to metallization M1 and the cathode of which corresponds to metallization M30. Metallization M1 corresponds to an external terminal and to a link between the anode of thyristor T2 and the cathode gate of the high voltage thyristor T1 formed in the right portion of the component. This thyristor T1 is able to withstand the mains voltage. Metallization M32 corresponds to the anode gate of thyristor T2. Metallization M30 corresponds to the cathode 32 of thyristor T2 and to a terminal of a resistor R, the other terminal of which is connected to the cathode gate of the thyristor. Metallization M31 corresponds to the cathode of a Zener diode D2, the anode of which is connected to the gate of thyristor T2. This metallization M31 is connected to cathode metallization K or in common with it.

Thus, a main portion of a control system of a push button neon tube bank such as shown in FIG. 4 has been formed.

The circuit of FIG. 4 is a circuit of thyristor microfuse type associated with fluorescent tubes, commonly called neon tubes, 40-1, 40-2, etc., arranged in parallel and associated with short-circuiting push buttons BP1, BP2, etc. A terminal of these neon tubes is connected to the mains (220 $V_{ac}$) and their other terminal is connected to the second mains terminal, currently the ground, via a resistor R1, main thyristor T1, and the parallel assembly of a resistor R2 and a capacitor C2. A protection component (GMOVE) is arranged between the anode of thyristor T1 and the ground. The other components of the circuit have already been described in relation with FIG. 3.

In normal state, the voltage on a terminal 41, connected via a resistor R3 to the gate of thyristor T1 and to the anode of thyristor T2 is at a positive potential, for example 5 V. Thus, thyristor T1 conducts and the neon tubes are on.

When a push button is pushed, one or several of the neon tubes are short circuited and the current increases in thyristor T1. As a result, the voltage on capacitor C2 increases. When this voltage reaches the avalanche value of Zener diode 2, thyristor T2 enters conduction and the gate of thyristor T1 is at a more negative potential than its cathode. This difference is enough to trigger off thyristor T1 which blocks. Thus, the current through the neon tubes is interrupted. This state remains as long as the potential on terminal 41 is 5 V.

To trigger back the system, the voltage on terminal 41 has to be brought back to 0 volt (RESET), which triggers off thyristor T2, then back to 5 V, which triggers back thyristor T1. Preferably, the circuit further includes a terminal 42 (corresponding to metallization M32), that is, at the anode gate of thyristor T2. The voltage on this terminal constitutes an indication of the conducting or non-conducting state of thyristor T2. A voltage of approximately 5 V indicates that thyristor T2 is blocked, a voltage of approximately 0 V indicates that thyristor T2 conducts. This translates the conducting or non-conducting state in the neon tubes.

Figure 5:
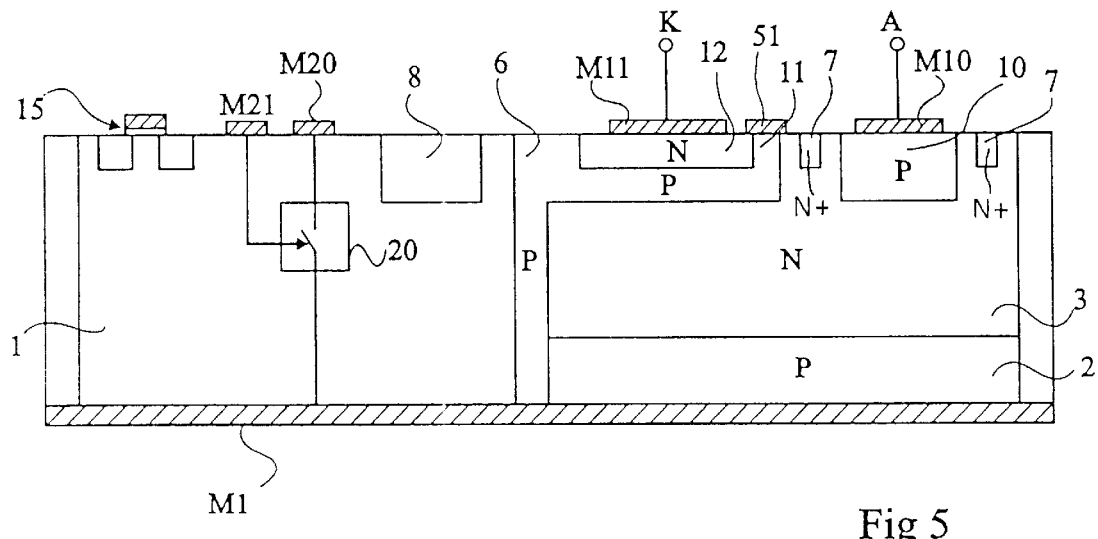
FIGS. 5 and 6 partially show, in the form of blocks, alternative monolithic structures incorporating a high voltage component and logic circuits according to the present invention.
Figure 6:
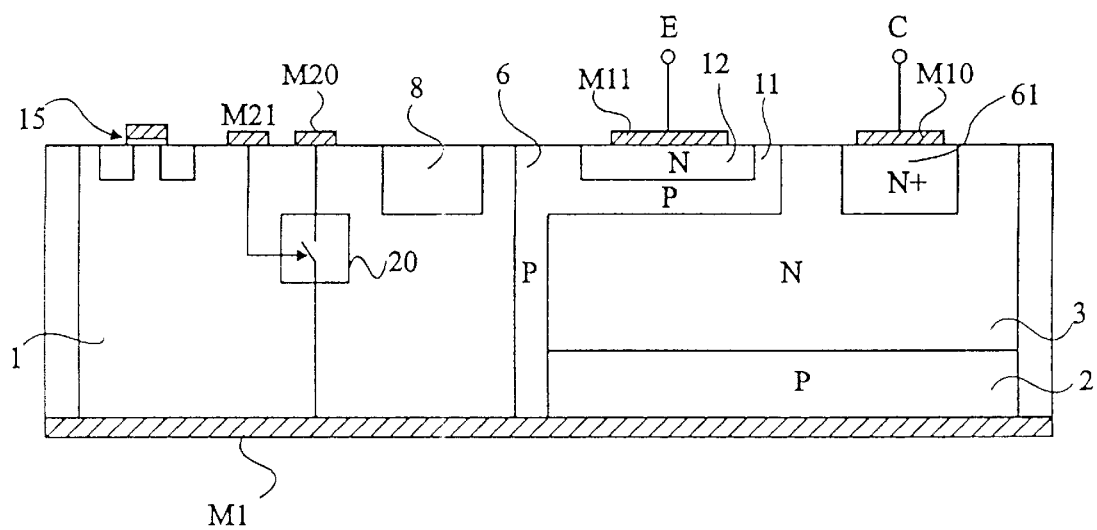

FIGS. 5 and 6 show variants of the present invention and constitute two examples of structure according to the present invention which differ by the nature of the lateral power component. FIGS. 5 and 6 substantially reproduce the design of FIG. 2 and the same components are referred to by the same reference numbers.

In FIG. 5, the power thyristor is modified and an insulated grid 51 is added thereto. Grid 51 is arranged above a portion of cathode gate region 11 of the thyristor which separates cathode region 12 from substrate 1. Thus, a thyristor which can be controlled to turn on by an action on the grid and controlled to turn off by an action on the gate, corresponding to the rear surface metallization is obtained.

In the case of FIG. 6, the thyristor is replaced with a lateral NPN transistor, that is, P-type region 10 is replaced with an N+-type region 61. Then, metallization M10 corresponds to a collector terminal C and metallization M11 to an emitter terminal E. Rear surface metallization M1 then corresponds to a base terminal.

The several variants and examples of application of the present invention have been described as examples only, and those skilled in the art will understand that the several improvements commonly brought to the several components shown can be applied within the frame work of the present invention.

Of course, the present invention is likely to have various alterations, modifications, and improvements which will readily occur to those skilled in the art. Such alterations, modifications, and improvements are intended to be within the spirit and scope of the present invention. Accordingly, the foregoing description is by way of example only and is not intended as limiting. The present invention is limited only as defined in the following claims and the equivalents thereto.

What is claimed is:

1. A monolithic component formed in a lightly-doped semiconductor wafer of a first type of conductivity, a lower surface of the wafer being uniformly coated with a metallization, the monolithic component comprising at least two portions separated by an insulating wall of a second type of conductivity, the at least two portions including:

a first portion including at least one laterally implemented high voltage component having a control region of the second type of conductivity, the insulating wall being in electrical contact with the control region, the at least one high voltage component including a thick region that is formed from the semiconductor wafer of the first type of conductivity, the thick region occupying a majority of a thickness of the wafer; and a second portion including a plurality of logic circuit components, the plurality of logic circuit components including at least one vertical component having a main terminal which corresponds to the lower surface metallization.

2. A monolithic component according to claim 1, wherein the lower surface of the wafer includes a semiconductor layer having the second type of conductivity.

3. A monolithic component according to claim 1, wherein the first type of conductivity is type N, the second type of conductivity is type P, and the at least one high voltage component is a lateral thyristor having a cathode gate region that is connected to the insulating wall.

4. A monolithic component according to claim 1, wherein the at least one vertical component of the second portion is a thyristor.

5. A monolithic component according to claim 1, wherein the at least one high voltage component is a lateral transistor having a base region that is connected to the insulating wall.

6. A monolithic component according to claim 1, wherein the at least one high voltage component is a lateral insulated grid turn-on and gate turn-off thyristor, having a cathode gate region that is connected to the insulating wall.

7. A monolithic component comprising:

a semiconductor wafer of a first type of conductivity;

an insulating wall of a second type of conductivity to separate the semiconductor wafer into first and second portions, said first portion including at least one high voltage component, said at least one high voltage component including a lateral component having a control region of the second type of conductivity, said second portion including at least one logic circuit component, said at least one logic circuit component including a vertical component;

means for electrically connecting said insulating wall and said control region; and a rear surface metallization in contact with a rear surface of the semiconductor wafer.

8. A monolithic component according to claim 7, wherein the lateral component includes a thick region formed from the semiconductor wafer of the first type of conductivity, the thick region occupying a majority of a thickness of the semiconductor wafer.

9. A monolithic component according to claim 7, wherein the rear surface metallization includes a uniformly coated metal layer.

10. A monolithic component according to claim 9, wherein said vertical component has a main terminal formed by the rear surface metallization.

11. A monolithic component according to claim 7, including a semiconductor layer of the second type of conductivity on the rear surface of the semiconductor wafer.

12. A monolithic component according to claim 7, wherein the first type of conductivity is type N and the second type of conductivity is type P.

13. A monolithic component according to claim 12, wherein said lateral component is a lateral thyristor having a cathode gate region as said control region.

14. A monolithic component according to claim 13, wherein the means for electrically connecting includes said cathode gate region contacting said insulating wall.

15. A monolithic component according to claim 7, wherein said vertical component is a thyristor.

16. A monolithic component according to claim 7, wherein said lateral component is a lateral transistor having a base region as said control region.

17. A monolithic component according to claim 16 including, wherein the means for electrically connecting includes said base region contacting said insulating wall.

18. A monolithic component according to claim 7, wherein said lateral component is a lateral, insulated, grid turn-on, and gate turn-off thyristor having a cathode gate region as said control region.

19. A monolithic component according to claim 18, wherein the means for electrically connecting includes said cathode gate region contacting said insulating wall.

20. A monolithic component formed in a semiconductor wafer of a first type of conductivity, the semiconductor wafer having a first surface and a second surface opposing the first surface, the monolithic component comprising:

at least one insulating wall of a second type of conductivity;

at least two portions, each portion of the at least two portions being separated from another of the at least two portions by the at least one insulating wall, the at least two portions including:

a first portion including at least one high voltage component; and a second portion including at least one vertical component;

at least one first metallization coating the first surface of the semiconductor wafer; and at least one second metallization coating the second surface of the semiconductor wafer.

21. A monolithic component according to claim 20, wherein the high voltage component includes a thick region formed from the semiconductor wafer of the first type of conductivity, the thick region occupying a majority of a thickness of the semiconductor wafer.

22. A monolithic component according to claim 20, wherein the at least one second metallization contacts at least the first portion and the second portion, a terminal of the at least one vertical component being formed by the at least one second metallization.

23. A monolithic component according to claim 22, wherein the at least one high voltage component is implemented laterally in the first portion and includes a control region of the second type of conductivity, the control region being electrically connected to the at least one insulating wall.

24. A monolithic component according to claim 23, wherein the at least one insulating wall contacts the at least one second metallization.

25. A monolithic component according to claim 20, including a semiconductor layer having the second type of conductivity and contacting the at least one second metallization in at least the first portion.

26. A monolithic component according to claim 25, wherein the semiconductor layer contacts the at least one insulating wall.

27. A monolithic component according to claim 26, wherein the high voltage component is a lateral thyristor having a cathode gate region.

28. A monolithic component according to claim 27, wherein the cathode gate region is connected to the at least one insulating wall.

29. A monolithic component according to claim 26, wherein the high voltage component is a lateral transistor having a base region.

30. A monolithic component according to claim 29, wherein the base region is connected to the at least one insulating wall.

31. A monolithic component according to claim 26, wherein the high voltage component is a lateral, insulated, grid turn-on, and gate turn-off thyristor having a cathode gate region.

32. A monolithic component according to claim 31, wherein the cathode gate region is connected to the at least one insulating wall.

33. A monolithic component according to claim 20, wherein the at least one vertical component is a thyristor.

* * * * *